(12) United States Patent
Tatsumi

(10) Patent No.: US 6,446,033 B1
(45) Date of Patent: Sep. 3, 2002

(54) METHOD FOR SIMULATING ELECTRICAL CHARACTERISTICS OF ELECTRONIC DEVICE

(75) Inventor: Takaaki Tatsumi, Kanagawa (JP)

(73) Assignee: Sony Corporation (JP)

( * ) Notice: Subject to any disclaimer, the term of this patent is extended or adjusted under 35 U.S.C. 154(b) by 1097 days.

(21) Appl. No.: 08/533,939

(22) Filed: Sep. 26, 1995

(30) Foreign Application Priority Data

Sep. 29, 1994 (JP) ............................................ P06-259545

(51) Int. Cl.⁷ ............................................... G06F 9/455
(52) U.S. Cl. .................................. 703/14; 703/2; 716/5
(58) Field of Search ................................ 364/488–491, 364/578; 395/500; 703/2, 14; 716/5

(56) References Cited

U.S. PATENT DOCUMENTS

| | | | |
|---|---|---|---|
| 5,247,468 A | * 9/1993 | Henrichs et al. ............. | 364/578 |
| 5,278,770 A | * 1/1994 | Gore et al. .................. | 364/490 |
| 5,471,403 A | * 11/1995 | Fujimaga ..................... | 364/488 |
| 5,550,756 A | * 8/1996 | Wolff .......................... | 364/491 |
| 5,579,249 A | * 11/1996 | Edwards ...................... | 364/578 |
| 5,610,833 A | * 3/1997 | Chang et al. ................ | 364/491 |

FOREIGN PATENT DOCUMENTS

EP 0 493 072 A2 7/1992

OTHER PUBLICATIONS

Gough, Paul A., et al., "An Integrated Device Design Environment for Semiconductors", IEEE Transactions on Computer–Aided Design of Integrated Circuits and Systems, No. 8, Jun. 10, 1991.

Ciampolini, Paolo, et al., "Efficient 3–D Simulation of Complex Structures", IEEE Transactions on Computer–Aided Design of Integrated Circuits and Systems, No. 9, Sep. 10, 1991.

* cited by examiner

Primary Examiner—Russell W. Frejd
(74) Attorney, Agent, or Firm—Rader, Fishman & Grauer PLLC; Ronald P. Kananen, Esq.

(57) ABSTRACT

There is provided a method for simulating the electrical characteristics of an electronic device including a step of specifying the material, electrical characteristics, and shape of a part of interest of the electronic device, the specification of the shape being performed by selecting it from among several preselected simplified shape models to obtain required data easily. Further, it is possible to reuse such data as input data for various simulators. The data can be accurately created in a shorter period of time.

18 Claims, 14 Drawing Sheets

OVERALL CONFIGULATION OF INPUT DATA GENERATION APPARATUS FOR SIMULATION OF ELECTRICAL CHARACTERISTICS OF SEMICONDUCTOR DEVICE ACCORDING TO FIRST EMBODIMENT

EXAMPLE OF SPECIFIABLE SHAPE (CONE)

EXAMPLE OF SPECIFIABLE SHAPE (HEXAHEDRON)

SPECIFIABLE SHAPE ( SPOON-CUT SHAPE )

SPECIFICATION OF HEXAHEDRON name:004
shape:slant — (A) SLANTING LINE
contact:1
raw:A1
xmesh:4
ymesh:4
zmesh:4
x+:002 — (B) IN THIS CASE, A SHAPE NAMED 002 IS
x-:003    CONNECTED TO THE SIDE OF y-z FACE
          WHERE VALUE OF x IS LARGER, AND
          A SHAPE NAMED 003 IS CONNECTED
          TO THE SIDE WHERE VALUE OF x IS
          SMALLER. IF NOTHING IS WRITTEN,
          THOSE SIDES ARE ELECTRODE.

SPECIFICATION OF SPOON-CUT SHAPE name:004
shape:spoon — (C) SPOON-CUT
h:10
sp_z:9 — (D) z-COORDINATE VALUE OF CENTER OF SPHERE
center_z:10
center_x:4 — (E) x-, y-, AND z-COORDINATE VALUES OF UPPER END OF CENTRAL AXIS
center_y:5
raw:NULL
sp_rad:3 — (F) RADIUS OF SPHERE
co_rad:2 — (G) RADIUS OF CYLINDER

FORMAT FOR SPECIFYING SHAPE

TOP VIEW

METHOD FOR SIMULATING ELECTRICAL CHARACTERISTICS OF ELECTRONIC DEVICE

BACKGROUND OF THE INVENTION

1. Field of the Invention

The present invention relates to a method for simulating the electrical characteristics of an electronic device and an apparatus for generating input data for the simulation of the electrical characteristics of an electronic device. For example, the present invention can be used as a technique to generate input data for various simulators and a tool for generating such data wherein information required for data to be used in the simulation of the capacity and current density of a line in a semiconductor device and the like is easily created on a computer with the aid of three dimensional shape input.

2. Description of the Related Art

The so-called 3D-CAD's (three-dimensional computer aided designers) including IDEAS (the trademark of a CAD from Structural Dynamic Res. Corp.) are known as data input apparatuses for three-dimensional simulation. Such general purpose three-dimensional input apparatuses have the following problems when used for the simulation of the capacity and current density of a line in a semiconductor device.

(1) Although various shapes can be input and complicated shapes can be specified, this requires an operator to master many operations. In the field of semiconductor devices wherein only a few kinds of simple shapes need to be input, such a technique unnecessarily increases complicatedness in operation.

(2) With such a technique, it is difficult to specify only a particular attribute of a shape, e.g., the specific resistance of a certain solid and whether a certain plane is an electrode or not.

(3) It is difficult to specify the relationship between shapes, e.g., whether they are continuous and whether they are parts of the same electrode.

On the other hand, simulation tools for electrical devices which are available on the market are conversely limited in the kinds of shapes that can be input using them (they can only input rectangular solids or the like). This is not sufficient to satisfy the actual needs in the art.

In consideration to such problems, there is a need for a system which allows the input of only particular shapes that are required for the simulation of a semiconductor device to simplify input operations and with which only required attributes can be reliably and simply set. However, no technique has been developed to achieve such a goal.

It is an object of the present invention to provide a technique suitable for the simulation of a semiconductor device. More specifically, it is an object of the present invention to provide a method for simulating the electrical characteristics of a semiconductor device and an input data generation apparatus for the simulation of the electrical characteristics of a semiconductor device which allow, for example, the simulation of the capacitance an d current density of a line in a semiconductor device to be carried out in such a manner that required data can be easily obtained, for example, on a screen and can be reused as input data for various simulators; data can be accurately generated; and the time for such operations can be shortened.

SUMMARY OF THE INVENTION

According to the present invention, the above-described object is achieved by a method for simulating the electrical characteristics of an electronic device, e.g., semiconductor device which includes a step of specifying the material, electrical characteristics and shape of a part of interest of a semiconductor device, the specification of the shape being performed by selecting it from among several preselected simplified shape models.

According to another aspect of the invention, the above-described object is achieved by a method for simulating the electrical characteristics of a semiconductor device wherein a shape is specified by selecting it from among a truncated-conical shape, a hexahedral shape, and a spoon-cut shape.

According to another aspect of the invention, the above-described object is achieved by a method for simulating the electrical characteristics of a semiconductor device wherein a hexahedral shape is specified by selecting it from among rectangular solids and a shape connecting rectangular solids.

According to another aspect of the invention, the above-described object is achieved by a method for simulating the electrical characteristics of a semiconductor device wherein the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

According to another aspect of the invention, the above-described object is achieved by an apparatus for generating input data for simulation which generates input information required for the simulation of the electrical characteristics of an electronic device, e.g., a semiconductor device wherein the material, electrical characteristics and shape of a part of interest of a semiconductor device is specified, the specification of the shape being performed by selecting it from among several preselected simplified shape models.

According to another aspect of the invention, the above-described object is achieved by an apparatus for generating input data for the simulation of the electrical characteristics of a semiconductor device wherein a shape is specified by selecting it from among a truncated-conical shape, a hexahedral shape, and a spoon-cut shape.

According to another aspect of the invention, the above-described object is achieved by an apparatus for generating input data for the simulation of the electrical characteristics of a semiconductor device wherein a hexahedral shape is specified by selecting it from among rectangular solids and a shape connecting rectangular solids.

According to another aspect of the invention, the above-described object is achieved by an apparatus for generating input data for the simulation of the electrical characteristics of a semiconductor device wherein the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

In the context of the present invention, the term "material" refers to data indicating the substance(s) that constitutes an object, and the term "electrical characteristics" refers to data or the like indicating the resistance of the material (dielectric constant or specific resistance). According to the present invention, the material and electrical characteristics of a part of interest are set. In this case, the material and the dielectric constant (specific resistance) and the like which are the electrical characteristics thereof can be written in a database in advance, and a user can use such values or can arbitrarily set such values.

According to the present invention, a shape is specified by selecting it from among several preselected simplified shape models which are typically a truncated-conical shape, a hexahedral shape, and a spoon-cut shape. In the implementation of the present invention, three kinds of shapes, i.e., "hexahedral shape", "truncated-conical shape (including cylindrical shape)", and "spoon-cut shape", can be typically set as shapes that can be handled. Further, two kinds of hexahedral shapes, i.e., rectangular solids and a shape connecting rectangular solids, can be set.

It is possible to specify that an object is an electrode as an electrical characteristic (electrical attribute) especially when the object is specified as a hexahedron. In general, an electrode is an attribute of a face of a solid. An electrode may extend across a plurality of faces or a plurality of solids. Therefore, one face of a hexahedron may be specified as an "electrode". Alternatively, two or more faces of a hexahedron may be specified as an "electrode". Further, the present invention allows a configuration wherein two attributes, i.e., electrodes and connection can be easily defined as electrical characteristics. For example, electrodes can be specified in an item named "electrode No.".

The definition of a hexahedron that connects rectangular solids can be easily given by specifying the names of the two rectangular solids to be connected. In general, such definition of a hexahedron connecting straight lines is sufficient in an application limited to a line in a semiconductor device.

There is a method of defining overlapping relationships between shapes called CSG (constructive solid geometry) wherein an overall shape is defined by combining particular shapes. In general, CSG involves various operations on shapes (e.g., addition, subtraction, and multiplication) which are executed in combining (overlapping) primitives (basic shapes) prepared in advance. According to the present invention, however, the order in which shapes are input plays an important role and such definition can be given in accordance with only one rule that a figure is replaced by the next figure defined. In general, this rule solely suffices the requirements in the field of semiconductor devices, and this simplifies operations.

The format for storing shapes is represented in the form of a text file consisting of parameters that characterize shapes. Although shapes are normally processed on a shape input module, they may be directly created or edited by a text editor.

In the implementation of the present invention, a mesh generation module may be used to generate a mesh that depends on the shape which has been generated. Various tools available on the market may be used as a mesh generation module for such a purpose.

A simulation data generation module is a module for generating input data for a particular simulator based on shape data, attribute data, and the result of meshing.

DETAILED DESCRIPTION OF THE PREFERRED EMBODIMENTS

The preferred embodiments of the present invention will now be described with reference to the accompanying drawings. Needless to say that the present invention is not limited to the following embodiments wherein semiconductor devices are simulated and may be applied to electronic devices other than semiconductor devices. Specifically, MMIC's (microwave monolithic IC's), superconducting devices and the like can be simulated using the present invention.

The embodiments described herein are input data generation apparatuses for simulation for generating input information required for the simulation of the electrical characteristics of a semiconductor device. Especially, those embodiments have a configuration for the simulation of a line in a semiconductor device.

Figure 1:
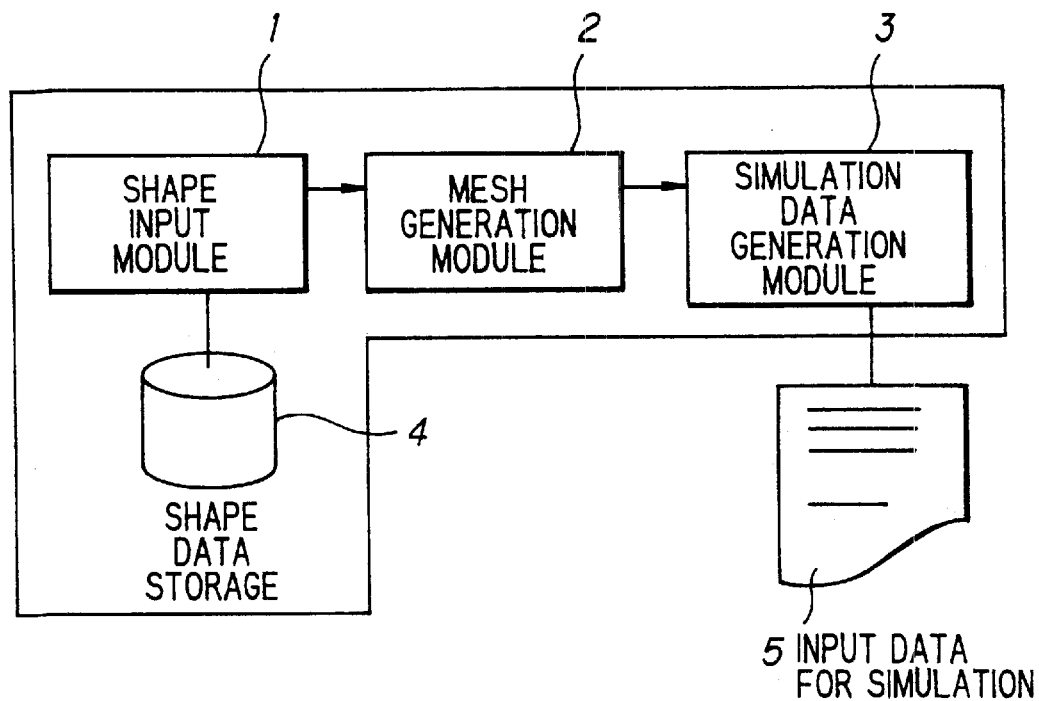
FIG. 1 illustrates an overall configuration of an input data generation apparatus for the simulation of the electrical characteristics of a semiconductor device according to a first embodiment of the invention.

FIG. 1 shows an overall configuration of a first embodiment of the present invention. The tool according to the present embodiment can be described as being generally comprised of three modules, i.e., a shape input model 1, a mesh generation module 2, and a simulation data generation module 3.

In the present embodiment, the shape input module 1 specifies the material, electrical characteristics, and shape of a part of interest of a semiconductor device. The specification of the shape is performed by selecting it from among several preselected simplified shape models.

In the present embodiment, a shape is specified by selecting it from among truncated-conical shape (including cylinders), hexahedral shapes, and spoon-cut shapes.

The specification of a hexahedral shape is performed by selecting either a rectangular solid or a shape for connecting rectangular solids.

The electrical characteristics to be simulated in the present embodiment are the electrical characteristics of a line in a semiconductor device. Therefore, the data input is data indicating the material of the line to be simulated, data indicating the resistance of the line, data specifying the positions of electrodes in the line, data specifying the shape of the line, and data indicating the relationship between lines.

The mesh generation module 2 divides the part of interest for positions to be calculated. The positions to be calculated are the positions of intersection points in the mesh. Thus, the positions to be calculated are given by deciding the positions of intersection points in the mesh.

The simulation data generation module 3 generates data required for simulation from the data given thereto.

The reference numeral 5 in FIG. 1 designates input data for simulation thus obtained. The data 5 is input to a simulator to be used for obtaining the final simulation results.

The data of shape, electrical characteristics (attributes) and the like input by the shape input module 1 can be stored in a data storage 4.

Figure 2:
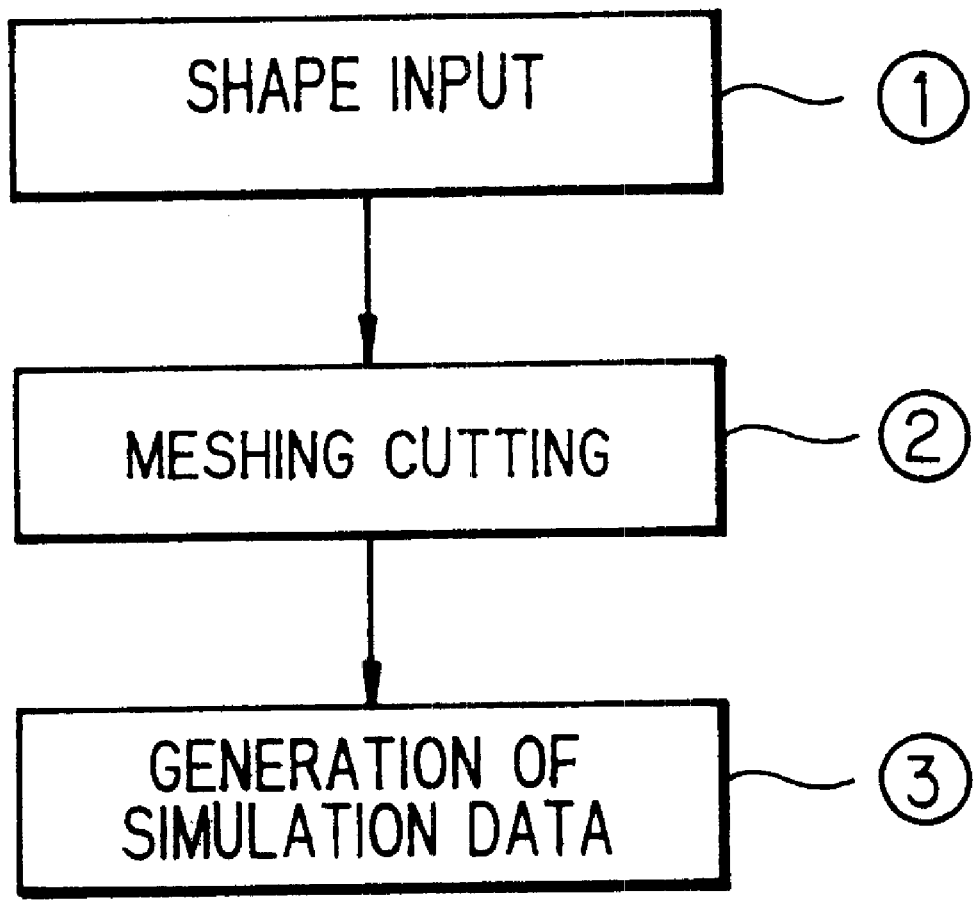
FIG. 2 illustrates a flow of processes in the first embodiment.

FIG. 2 shows a flow of processes performed by a user using the present embodiment. The following steps 1 through 3 correspond to the modules 1 though 3, respectively.
1. The attributes which are shape, material, and electrical characteristics of an object to be simulated are input using the shape input module.
2. Meshing is performed.
3. Data is generated depending on the simulator used.

Each of the mesh generation module 2 and simulation data generation module 3 can be replaced with a component, i.e., an independent module.

Specifically, by replacing the simulation data generation module 3, it is possible to generate data that can be used for various simulators from one kind of shape/attribute data.

Further, by replacing the mesh generation module, meshing can be performed in various ways based on one kind of shape/attribute data.

The shape input module 1 according to the present embodiment will now be described. Three kinds of shapes, i.e., "hexahedral shapes", "truncated-conical shapes (including cylinders)", and "spoon-cut shapes" can be processed. The spoon-cut shapes may be deleted. Hexahedral shapes are further categorized into rectangular solids and shapes for connecting rectangular solids.

Figure 3:
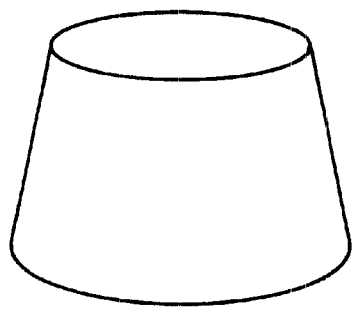
FIG. 3 shows an example of a shape (cone) which can be specified according to the first embodiment.
Figure 4:
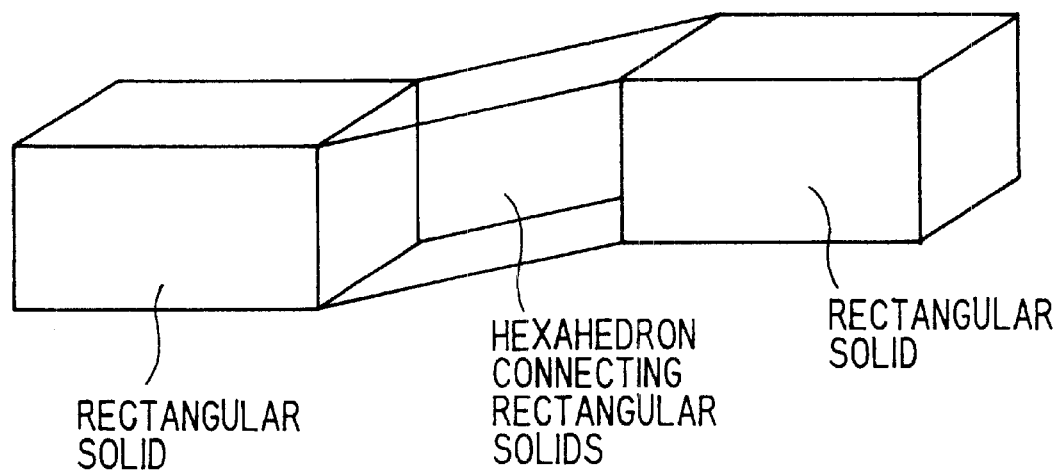
FIG. 4 shows an example of a shape (hexahedron) which can be specified according to a second embodiment of the present invention.
Figure 5:
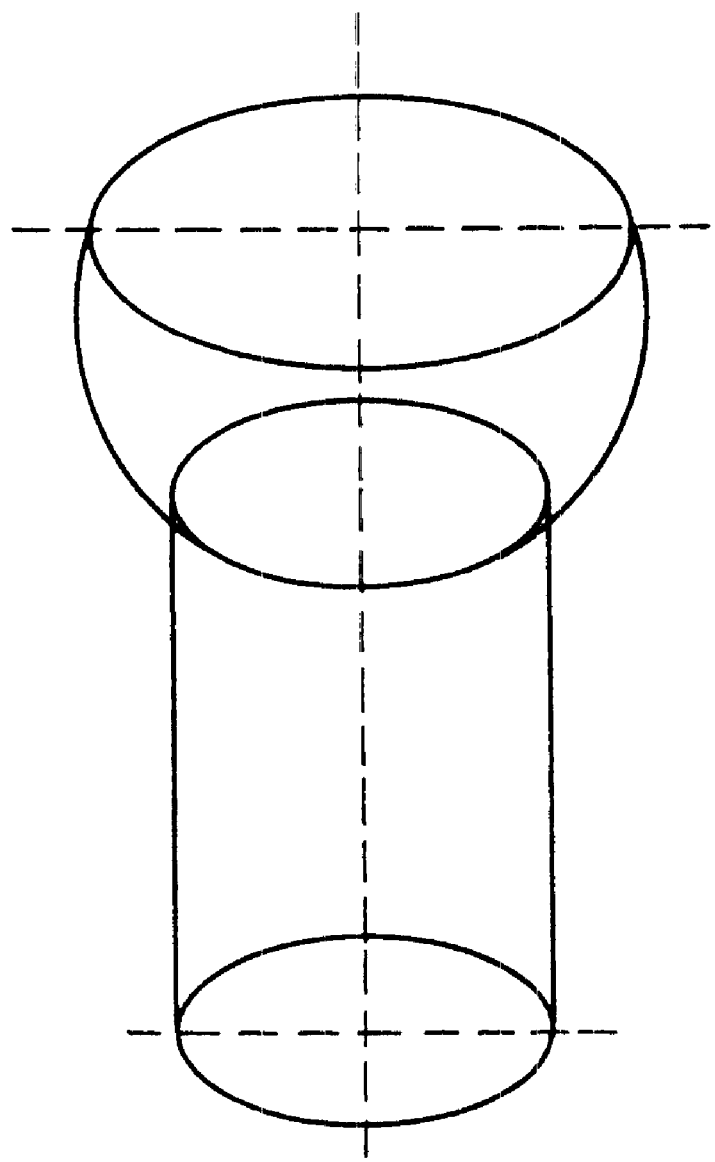
FIG. 5 shows an example of a shape (spoon-cut shape) which can be specified according to a third embodiment of the present invention.

Examples of those shapes are shown in FIGS. 3 through 5. FIG. 3 shows a conical shape (a tapered shape or a cylinder if the upper and bottom faces thereof are circles of the same size). FIG. 4 shows hexahedrons (rectangular solids and a hexahedron connecting the rectangular solids) according to a second embodiment of the invention. FIG. 5 shows a spoon-cut shape according to a third embodiment of the invention.

In general, shapes of the above-described kinds are sufficient to support the simulation of a semiconductor device, and this means that information to be specified can be reduced.

A description will now be made on a method of defining the shapes and attributes (material and electrical characteristics).

A user configures required part by combining shapes as described above. In the present embodiment, shapes are edited on the shape input module.

Figure 6A:
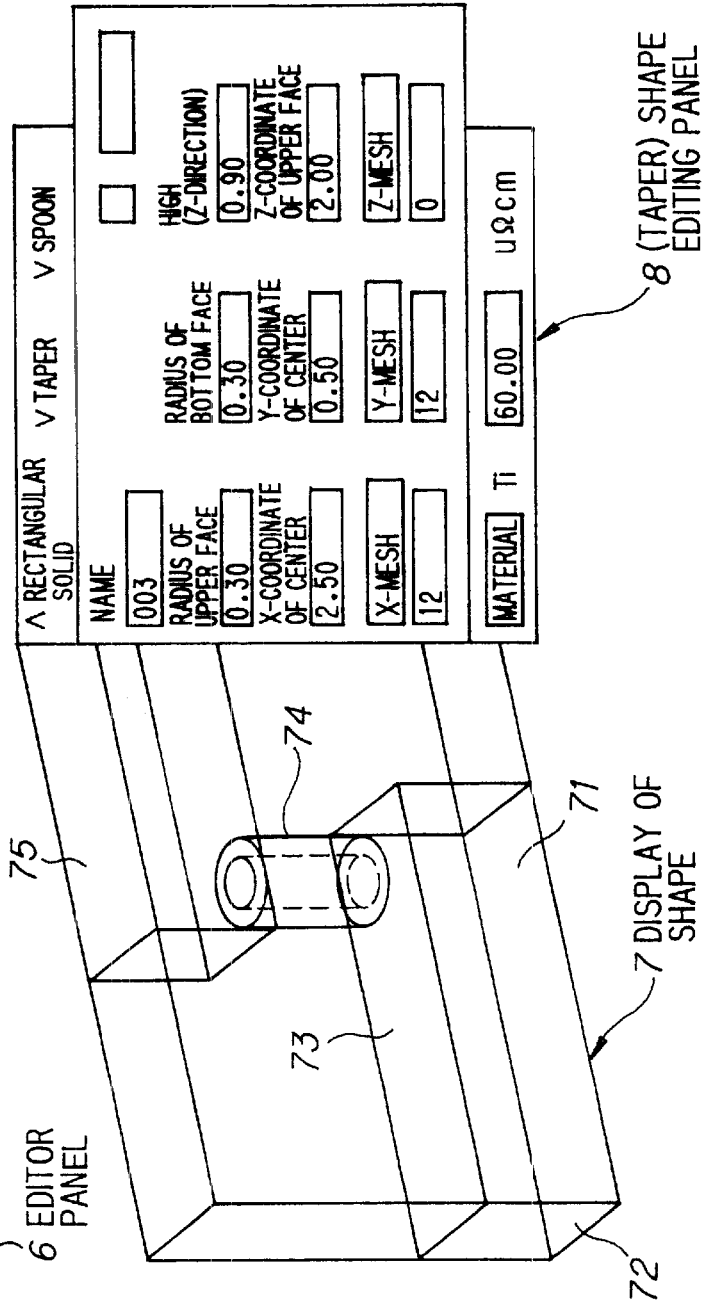
FIG. 6A is a screen for editing a structure wherein electrodes are connected by a contact according to a fourth embodiment of the present invention.

FIG. 6 shows an example of a screen for editing shapes using the shape input module according to a fourth embodiment of the present invention. The reference numeral 6 in FIG. 6 designates an editor panel which is a list showing shapes represented by texts. The reference numeral 7 designates a display of shapes on a screen. The actual shapes are specifically displayed on the screen in correspondence to the contents of the editor panel 6. The reference numeral 8 designates a shape editing panel which is a panel for editing one of the shapes shown on the editor panel 6.

In the example illustrated, a panel for editing the shape and attributes of a tapered shape (a conical shape and, more specifically, a connection hole in the form of a cylinder). Data can be simply written in the same manner for other shapes to allow any change in the shapes to be quickly checked.

Referring to the display of shapes indicated by the reference numeral 7, the reference numeral 71 designates a rectangular solid specified to indicate, for example, a first layer aluminum line. Attributes for electrodes (portions for connection) are given to one of the end faces thereof 72 and the upper face 73. The reference numeral 74 designates a cylindrical shape specified to indicate a connection hole for connection between lines, the upper and lower faces of which are given attributes for electrodes. The reference numeral 75 designates a rectangular solid specified to define a second layer aluminum line which is connected to the rectangular solid 71 indicating the first layer aluminum line by the cylindrical shape 74 indicating a connection hole (connection plug).

Specifiable shapes such as a rectangular solid, taper and spoon are displayed on the panel 8. Further, names can be displayed. The panel 8 illustrated is a drawing panel for specifying a tapered (conical) shape. The display includes the specifications for the radius of the upper face, the radius of the bottom face, the height, the X-Y coordinate of the center, the Z-coordinate of the upper face, and mesh specifications in X-, Y-, and Z directions which specifies how the shape is meshed. Further, the material (Ti is specified here) and the resistance as an electrical characteristic (attribute) are specified.

Although the specifications (edition) on the panel 8 can be made using a database, the specifications may be arbitrarily changed.

The specification of the material in the above specification (edition) process specifies from what the object is made, i.e., the material that constitutes the part of interest (the object in the connection hole in the example illustrated). Further, the dielectric constant or specific resistance of the material is set as the electrical quality of the material. Since the material and the dielectric constant (or specific resistance) thereof are written in an attribute database, a user can use those values or can set desired values.

In the case of a hexahedron, the attributes to be specified further includes electrodes. The electrode is an attribute of a certain face of an object. An electrode may extend across a plurality of faces or a plurality of solids. In this case, two attributes, i.e., the electrode and connection can be easily defined. Specifically, in FIG. 6A, the faces 72 and 73 of the rectangular solid 71 are electrodes, and it is possible to specify that the electrode 73 is connected to the bottom face of the cylinder 74. An electrode is specified here in an item named "electrode No.".

Figure 7A:
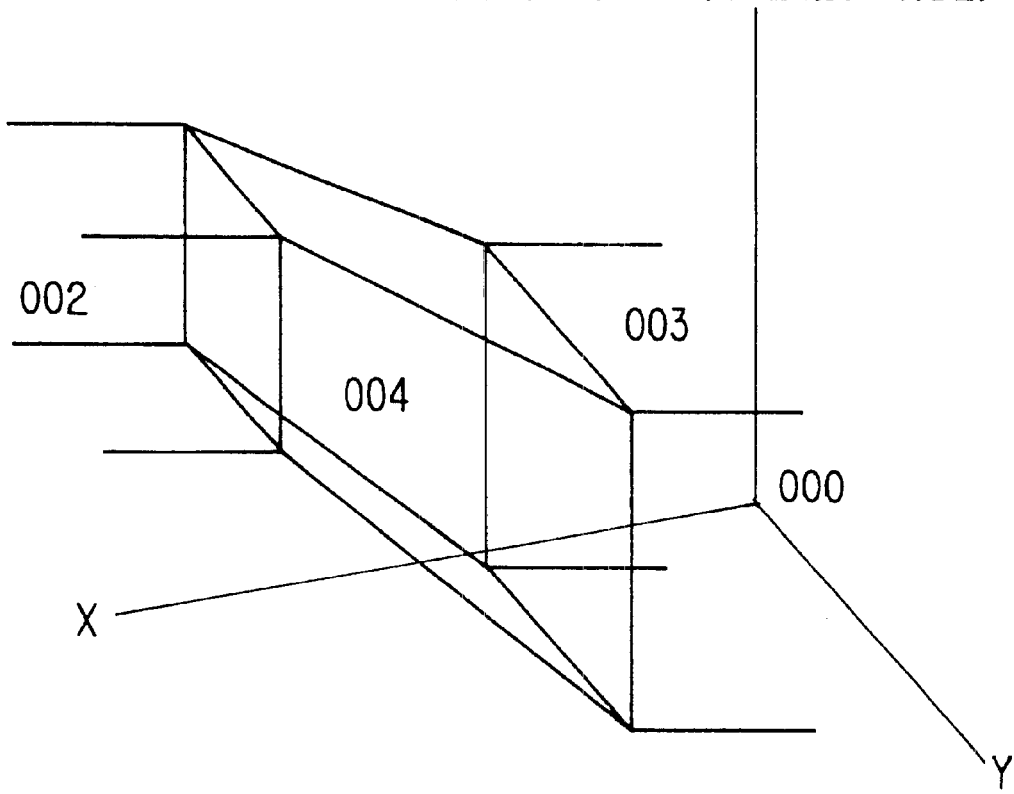
FIG. 7A shows a configuration wherein lines are connected using a hexahedral shape according to a fifth embodiment of the present invention.

The definition of a hexahedron connecting rectangular solids according to a fifth embodiment of the invention can be easily set by specifying the names of the two rectangular solids to be connected, as shown in FIG. 7A. Although complicated hexahedrons can not be defined, it is sufficient in an application limited to lines in a semiconductor device.

A specific description will be made on the definition of the hexahedron shown in FIG. 4 with reference to FIG. 7A. "shape:slant" shown by the reference symbol (A) in FIG. 7A shows indicates a slant line. In the illustrated example, a rectangular solid named "002" and a rectangular solid named "003" are connected to specify a hexahedron named "004". As indicated by (B) in FIG. 7A, according to this specification, the shape named "002" is connected to the side of the y-z plane where the value of x is larger and the shape named "003" is connected to the side where the value of x is smaller. If nothing is written here, it means that those sides are electrodes.

A specific example of meshing will be described.

Figure 7B:
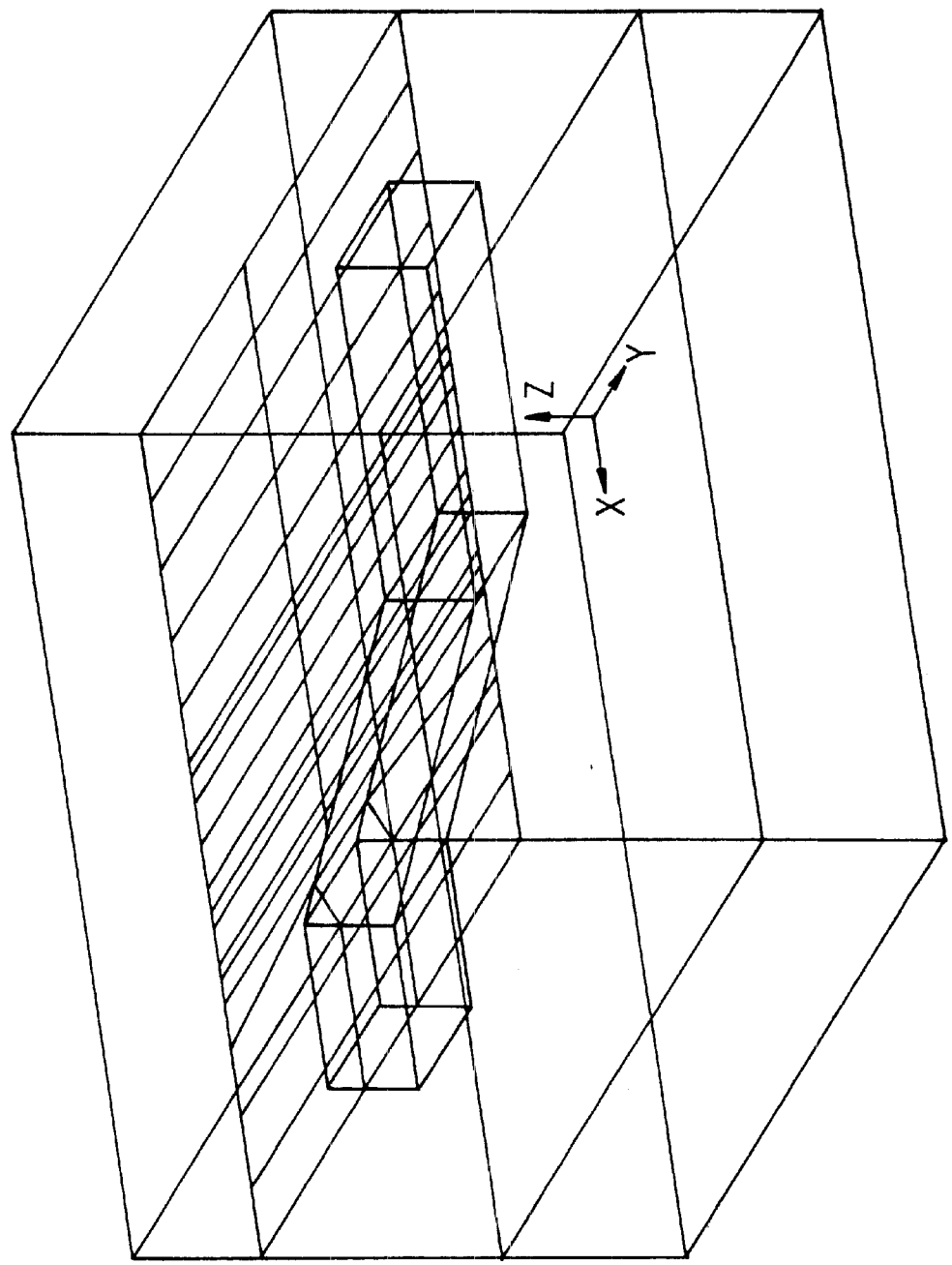
FIG. 7B and FIG. 7C are mesh diagrams according to the fifth embodiment.
Figure 7C:
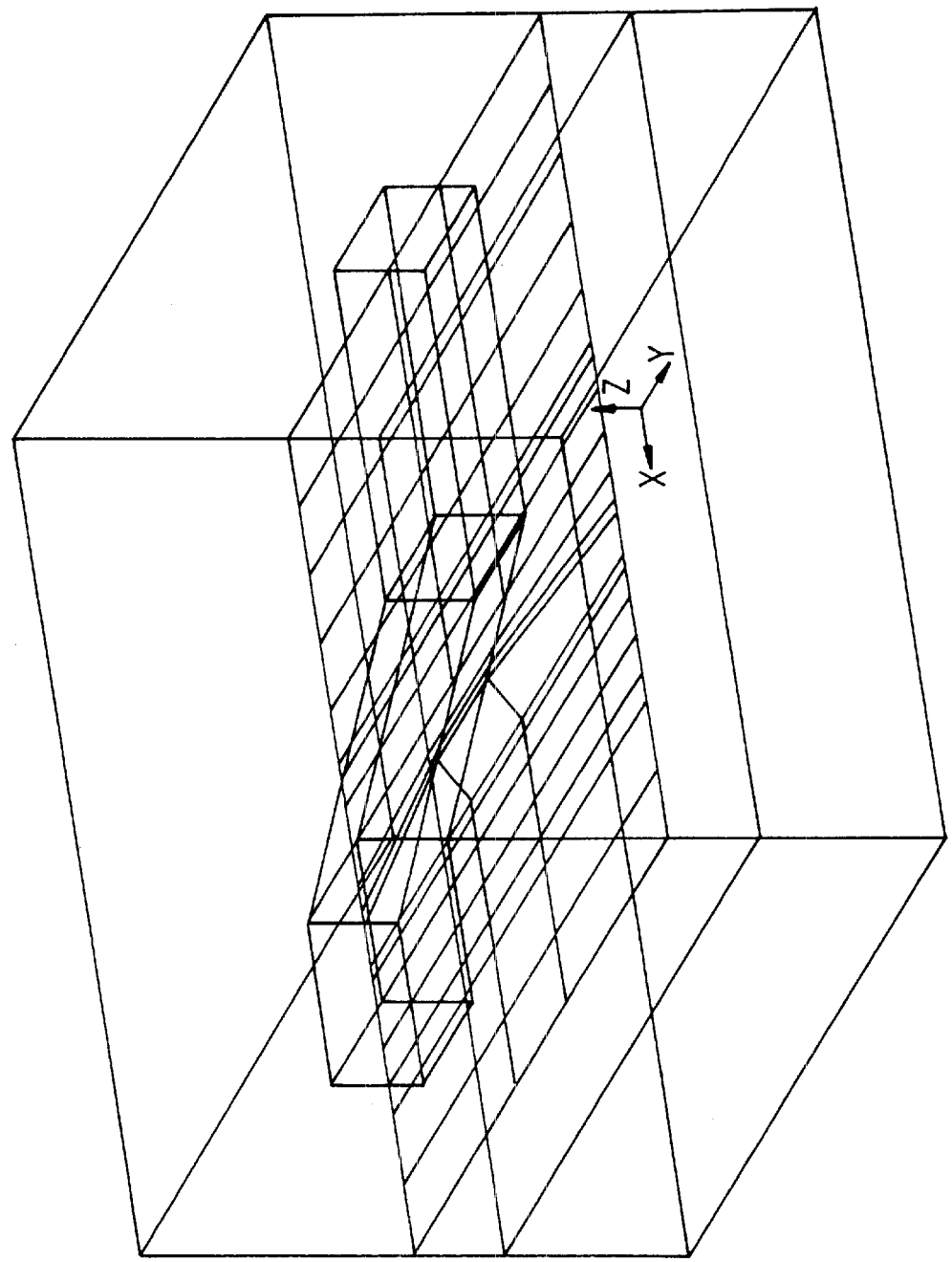

FIG. 7B and FIG. 7C show results of meshing performed on the shape specified by the hexahedron shown in FIG. 7A. In FIG. 7B, the mesh is located in the position of the upper face of the upper left rectangular solid. FIG. 7B shows meshing in the X-direction wherein the mesh is finer in the vicinity of the junction of the left rectangular solid and the rectangular solid in the middle and in the vicinity of the junction of the rectangular solid in the middle and the right rectangular solid. In other words, the mesh is finer in regions where significant changes occur to keep the error in the results of calculations carried out later from the actual values small.

FIG. 7C shows the result of meshing in the X-direction on the X-Y plane at another point in the Z-direction. This meshing is of course different from that shown in FIG. 7B because the direction of the inclination of the rectangular solid in the middle and the like cause changes which are different from those in FIG. 7B.

Although not shown, meshing in the Z-direction is not constant and varies depending on the degree of changes in the shape.

Figure 8A:
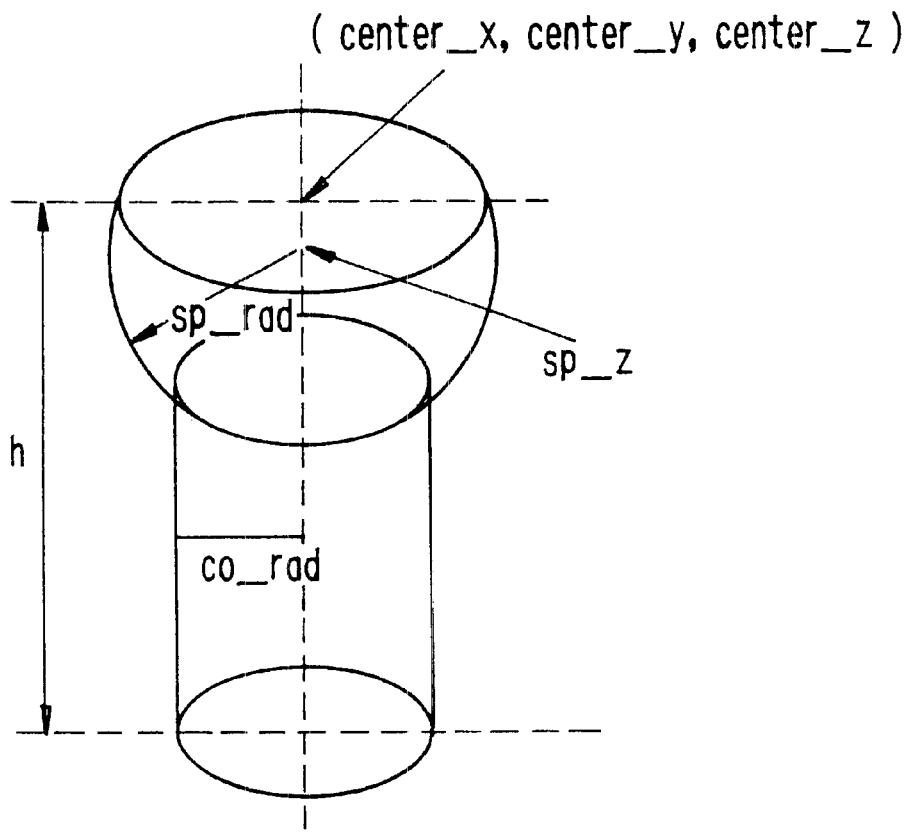
FIG. 8A shows a spoon-cut shape according to a sixth embodiment of the present invention.

A specific description will now be given on the specification of a spoon-cut shape according to a sixth embodiment of the present invention with reference to FIG. 8A. In FIG. 8A, "spoon" indicated by (C) indicates a spoon-cut shape; the specification of the Z-coordinate value of the center of the sphere is indicated at (D); X-, Y-, and Z-coordinate values of the upper end of the central axis are indicated at (E); the specification of the radius of the sphere is given at (F); and the specification of the radius of the cylinder is given at (G).

Figure 9:
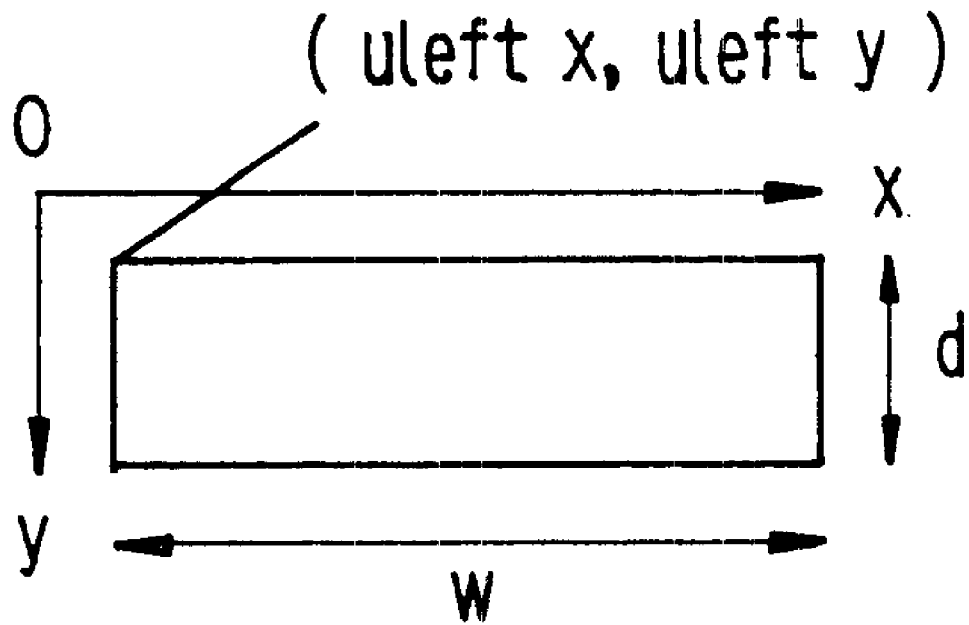
FIG. 9 illustrates a format for graphic specification according to a seventh embodiment of the present invention.

The specification as described above will be summarized with reference to a format for storing shape specifications. Such a format as a ninth embodiment of the invention will be described with reference to FIG. 9 which is a plan view thereof. The text data is displayed as follows.

x10

— name:001 shape:cube contact:1 raw: $SiO_2$ w:8.0 d:6.0 h:2.0 uleft_x:0 u_lefty:0 top:2.0 xmesh:8 ymesh:8 zmesh:8 xms_fc:FINETOC yms_fc: COARSETOF zms_fc:FTOCTOF x+:no x−:no

—

The meanings of major items of the above-described text data are as follows.

"x10" means that a 10×magnification is performed during simulation (no magnification is performed if nothing is written. "shape:cube" means that the shape is a rectangular solid. "contact:1" is the electrode No. "raw:$SiO_2$" indicates the material. w, d, and h indicate the width, depth, and height, respectively. "uleft_x:0" and "uleft_y:0" are 0 if nothing is written. "top:2.0" indicates the Z-coordinate value of the upper face. "xmesh:8", "ymesh:8", and "zmesh:8" indicate the manner in which the mesh is provided and means a uniform mesh if nothing is written here. "xms_fc:FINETOC" indicates that the mesh becomes coarser. "yms_fc:COARSETOF" indicates that the mesh becomes finer. "zms_fc:FTOCTOF" indicates that the mesh is finer at both ends in the Z-direction and coarser in the middle. These items specify the mesh. "x+:no" is information on each section. "x−:no" indicates that there is no electrode. "—" indicates a contact, i.e., an electrode.

The storage of a shape according to the present embodiment is in representation (syntax) as a text file of, for example, rectangular solids and a hexahedron connecting the rectangular solids. The shape is processed on the shape input module but may alternatively be directly created and edited using a text editor.

Any mesh generation module may be used in the present embodiment as long as it can generate a mesh in accordance with the shape generated. Various tools are available on the market as such a mesh generation module.

The simulation data generation module can be configured as a module for generating data to be input to a particular simulator based on the shape data, attribute data, and the result of the meshing.

Figure 8B:
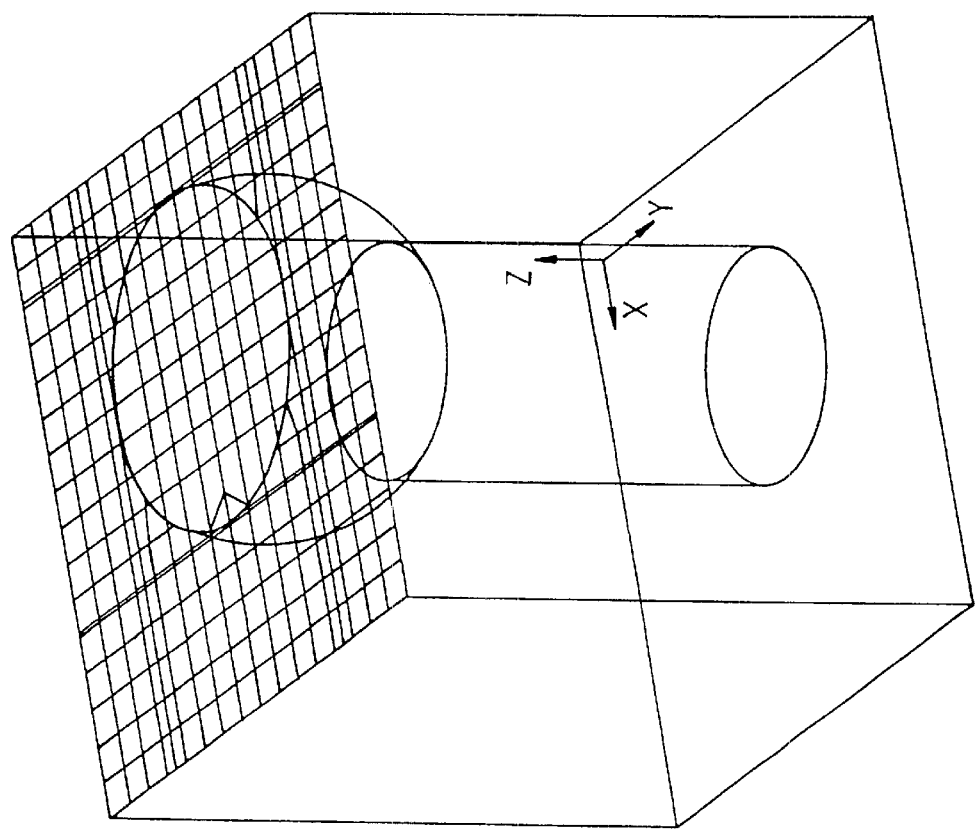
FIG. 8B and FIG. 8C are mesh diagrams according to the sixth embodiment.
Figure 8C:
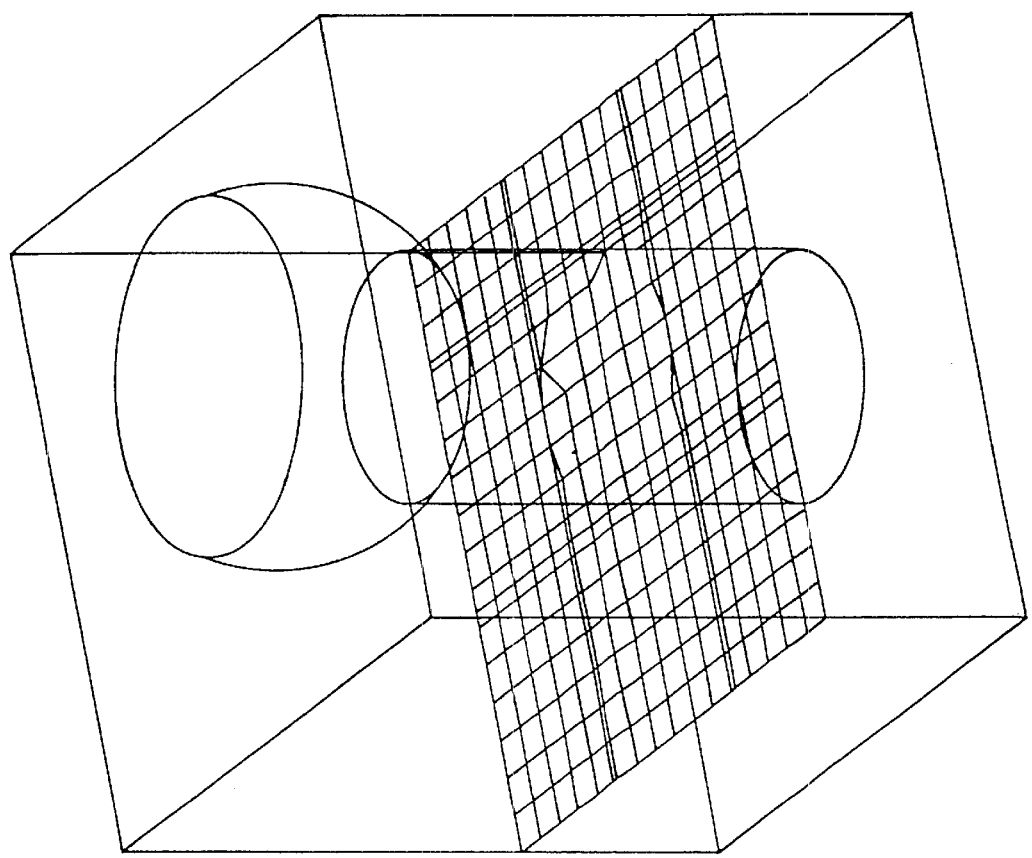

FIG. 8A shows a spoon-cut shape, and FIG. 8B and FIG. 8C show results of meshing performed there.

FIG. 8B shows the result of meshing performed on the X-Y plane at the upper face of the spoon-cut shape. The section of the spoon-cut shape at the X-Y plane of the upper face is circular. The mesh is finer in the vicinity of the circumference of the circle and gradually becomes coarser toward the center of the circle.

FIG. 8C shows the result of meshing performed at another point in the Z-direction. The section of the spoon-cut shape at the illustrated position is also circular, and the mesh is finer in the vicinity of the circumference of the circle.

In the Z-direction, the mesh may be finer at the spherical portion of the spoon-cut shape and the portion of the upper end of the cylinder and may become coarser toward the lower part of the cylinder (i.e., coarser in the −Z direction).

A description will be made on the overlapping of shapes which is a method of defining overlapping relationships between shapes called CSG (constructive solid geometry) wherein an overall shape is defined by combining particular shapes. In general, CSG involves various operations on shapes (e.g., addition, subtraction, and multiplication) which are executed in combining (overlapping) primitives (basic shapes) prepared in advance. According to the present invention, however, the order in which shapes are input plays an important role and such definition can be given in accordance with only one rule that a figure is replaced by the next figure defined. In general, this rule solely suffices the requirements in the field of semiconductor devices, and this simplifies operations.

For example, according to the prior art, a double cylinder is calculated by filling a substance in the form of a cylinder in an annular shape. On the other hand, according to the present invention, there is provided a system wherein a calculation equivalent to the prior art can be automatically carried out by first calculating a shape based on a first cylinder and by inserting a second cylinder having a diameter smaller than that of the first cylinder into the first cylinder.

If the order of the calculations is reversed, i.e., if the shape and material of the inner cylinder is first calculated and another cylinder to contain (cover) the cylinder therein is set and calculated, all calculations are carried out based on the shape and material of the cylinder which is set later. In this case, the product will be a single cylinder which is obviously different from the double-cylindrical shape consisting of an annulus ring and an internal cylinder as described above.

A description will be made on an embodiment of simulation using the method as described above with reference to FIGS. 6A, 6B, and 6C.

An example of the simulation of an electrostatic capacity between electrode lines.

In the case of a linear capacity, simpler expressions can be used. The relational expression is as shown below.

A capacity Cij between a plurality of electrodes can be defined by the following expression based on the bias condition ψi applied to the electrodes, and the amount of the charge induced thereby on the surface of an electrode i.

$$Q_i = \sum_{j=1}^{n} C_{ij}(\Psi_i - \Psi_j) + C_{ii}\Psi_i \qquad \text{Expression 1}$$

Further, electrostatic energy I is given by the following expression based on the capacitance between the electrodes Cij and the bias condition ψi applied to the electrodes.

$$I = \frac{1}{2}\sum_{i=1}^{n}\sum_{j=1}^{n} C_{ij}(\Psi_i - \Psi_j)^2 \qquad \text{Expression 2}$$

According to Expression 1, a capacitance C can be calculated by obtaining the amount of the charge induced on the surface of the electrodes. According to Expression 2, the capacity C is calculated by obtaining the electrostatic energy I. In the case of Expression 1, the Poisson's (or Laplace's) equation is solved to obtain the distribution of the potential and Gaussian integration is performed along the surface of the electrodes to obtain the amount of the charge on the surface of the electrodes. In the case of Expression 2, the distribution of the potential and the electrostatic energy are obtained on condition that there is an electrostatic field. The capacitance simulator employs Expression 2. The conditions of an electrostatic field can be given using approximation in accordance with the variational method. Such conditions are given based on the fact that the charge in an electrostatic field is distributed to minimize the energy which can be accumulated in the electrical field as a whole.

Therefore, it can be considered that if the electrostatic energy is not the minimum when the potential distribution has been established, the energy for moving the charge is supplied as the energy in the excess of the minimum value. According to the variational method, the condition for minimizing the electrostatic energy is that the partial differential of the potential distribution φ against the electrostatic energy I is 0.

The calculation of a capacity is carried out by first reading the structure to be analyzed specified by the user, bias conditions, and boundary conditions. At the same time, a mesh created by a tool for automatically generating an initial mesh is read to internally initialize the program.

Upon receiving the input as described above, the potential distribution and electrostatic energy are calculated using a double-framed core routine; it is determined whether the results are within allowable error ranges; and the calculations are carried out again with a finer mesh if there is a too big error. The evaluation of errors is carried out by checking whether or not the differences in the potential and electrostatic energy between adjoining meshes are greater than allowable values. The calculations are terminated when the differences come in the allowable error ranges. It can be considered that the accuracy of the results of the calculations are not dependent on the initial mesh because the mesh is regenerated after the evaluation of the errors. A brief description will be given below on what kind of calculation is carried out in the core routine.

Process 1

Electrostatic energy is given by the following expression based on an electrical field E (x, y, z) in the object of the analysis.

$$I = \int \frac{\varepsilon(x, y, z)E(x, y, z)^2}{2}dV \qquad \text{Expression 3}$$

In order to apply the finite-element method, the object to be analyzed is divided by the mesh into n pieces of triangular elements (triangular pyramids in the case three-dimensional analysis). If the electrostatic energy Ii of each element which is obtained by integrating the square of the electrical field of each element is defined on the assumption that ∈ (x, y, z) in one element is constant, the sum of the energy of those elements gives the overall electrostatic energy. The relationship between the electrostatic energy Ii and the overall electrostatic energy is given by the following expressions $$I = \frac{1}{2}\sum_{i=1}^{n} I_i \qquad \text{Expression 4}$$

$$I_i = \varepsilon_i \int\int\left(\left(\frac{\partial \Phi}{\partial x}\right)^2 + \left(\frac{\partial \Phi}{\partial y}\right)^2 + \left(\frac{\partial \Phi}{\partial z}\right)^2\right)dxdydz \qquad \text{Expression 5}$$

Figure 6B:
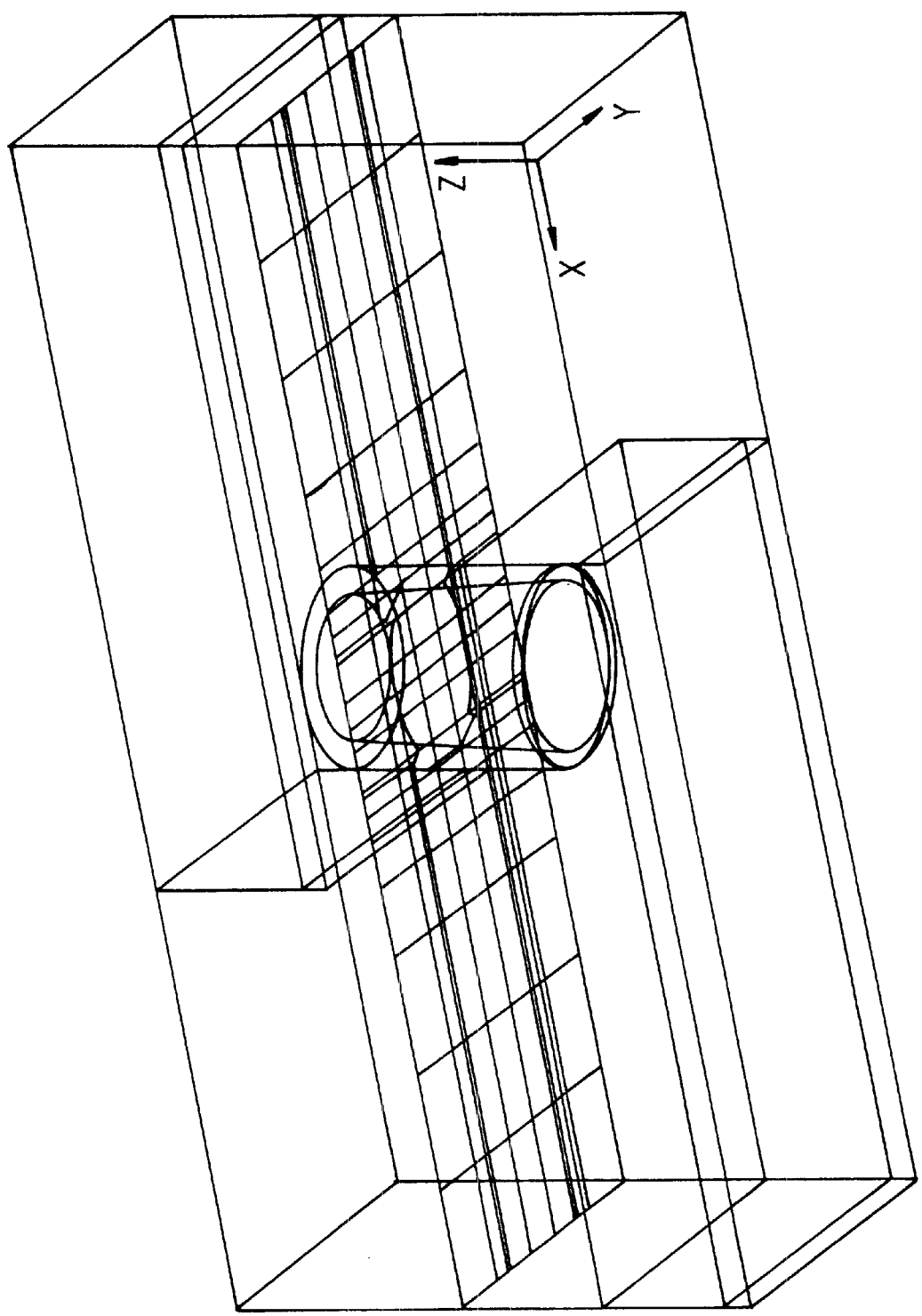
FIG. 6B and FIG. 6C are mesh diagrams according to the fourth embodiment.
Figure 6C:
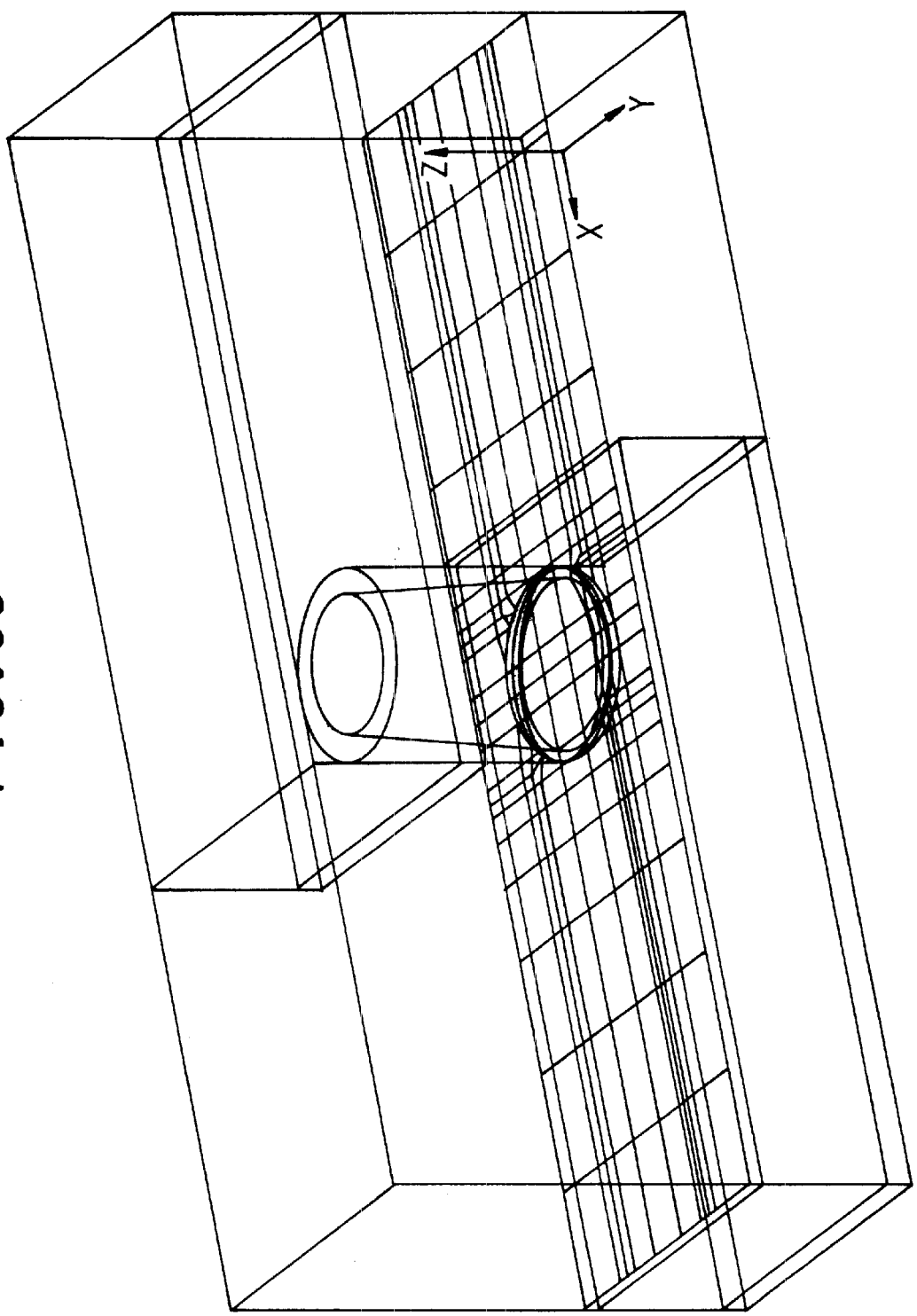

FIGS. 6B and 6C show how the mesh is generated.

FIG. 6B shows results of meshing performed in the X-and Y-directions on the X-Y plane at the boundary between the upper electrode and the upper end face of the cylinder. The mesh is finer in the vicinity of the boundary of the cylinder becomes coarser in the direction away from the cylinder and in the direction toward the center thereof.

FIG. 6C shows the result of meshing performed at another point in the Z-direction, i.e., at the boundary between the bottom (lower end) face of the cylinder and the lower electrode. The meshing performed in this position is basically the same as that shown in FIG. 6B.

Calculations are further made on triangular pyramids which are the minimum units from the coordinate of each of the above-described meshes.

Process 2

Expression 5 is carried out on each of the elements which has been divided in the form of a triangular pyramid. In order to simplify the integration in Expression 5, the Cartesian coordinates (x, y, z) are converted into triangular coordinates (ξ, η, ζ) This process is often employed in the finite-element method. The conversion of the coordinates of the elements according to the finite-element method for three-dimensional structures is given by the following expressions. As a result, the coordinate axes are positioned on the three sides extending from one vertex of an element as the origin.

$$x = x_1 + (x_2 - x_1)\xi + (x_3 - x_1)\eta + (x_4 - x_1)\zeta \quad \text{Expression 6}$$

$$y = y_1 + (y_2 - y_1)\xi + (y_3 - y_1)\eta + (y_4 - y_1)\zeta \quad \text{Expression 7}$$

$$z = z_1 + (z_2 - z_1)\xi + (z_3 - z_1)\eta + (z_4 - z_1)\zeta \quad \text{Expression 8}$$

As a result of the coordinate conversion, the partial differential is Expression 7 is converted using the following expression.

$$\begin{pmatrix} \frac{\partial \Phi}{\partial \xi} \\ \frac{\partial \Phi}{\partial \eta} \\ \frac{\partial \Phi}{\partial \zeta} \end{pmatrix} = \begin{pmatrix} \frac{\partial x}{\partial \xi} & \frac{\partial y}{\partial \xi} & \frac{\partial z}{\partial \xi} \\ \frac{\partial x}{\partial \eta} & \frac{\partial y}{\partial \eta} & \frac{\partial z}{\partial \eta} \\ \frac{\partial x}{\partial \zeta} & \frac{\partial y}{\partial \zeta} & \frac{\partial z}{\partial \zeta} \end{pmatrix} \begin{pmatrix} \frac{\partial \Phi}{\partial x} \\ \frac{\partial \Phi}{\partial y} \\ \frac{\partial \Phi}{\partial z} \end{pmatrix} \quad \text{Expression 9}$$

Next, the potential between the nodes is represented by shape functions. Specifically, the potential is represented by a function which is continuous along each side of the element. The potential is represented by a function of distance from the origin of the axis through the above-described coordinate conversion process. Typical shape functions are primary and secondary shape functions.

Primary Shape Function $$\Phi = N_1 \Phi_1 + N_2 \Phi_2 \quad \text{Expression 10}$$

Secondary Shape Function $$\Phi = N_1 \Phi_1 + N_2 \Phi_2 + N_3 \Phi_3 \quad \text{Expression 11}$$

The coefficients N1 and N2 in the primary shape function and the coefficients N1, N2 and N3 in the secondary shape function assume the values as shown below.

In order to improve accuracy, the potential distribution is represented using the secondary shape function. In the case of an element in the form of a three-dimensional triangular pyramid, potential values are given at the four vertices and six intermediate points. Therefore, the potential $\phi e$ at any point in the element can be given by the following expressions using the secondary shape functions.

$$\Phi_e = \Phi^T N \quad \text{Expression 12}$$

$$\Phi = (\Phi_1, \Phi_2, \Phi_3, \Phi_4, \Phi_5, \Phi_6, \Phi_7, \Phi_8, \Phi_9, \Phi_{10}) \quad \text{Expression 13}$$

$$N = \begin{pmatrix} (-1 + 2(1 - \eta - \xi - \zeta))(1 - \eta - \xi - \zeta) \\ \xi(-1 + 2\xi) \\ \eta(-1 + 2\eta) \\ \zeta(-1 + 2\zeta) \\ 4\xi(1 - \eta - \xi - \zeta) \\ 4\eta\xi \\ 4\eta(1 - \eta - \xi - \zeta) \\ 4\zeta(1 - \eta - \xi - \zeta) \\ 4\xi\zeta \\ 4\eta\zeta \end{pmatrix} \quad \text{Expression 14}$$

$$(0 \le \xi \le 1, 0 \le \eta \le 1, 0 \le \zeta \le 1)$$

Process 3

The integration in Expression 5 is simplified as a result of the coordinate conversion and shape functions, and potential vectors are obtained by the integral equation in Expressions 6 through 12. The bias applied to the electrostatic energy and a condition "$\delta I/\delta \phi = 0$" which assumes the minimum value under the boundary conditions (it is also a dispensation of nature) are applied to the resultant potential vectors, the following matrix of elements is obtained.

$$K_i \cdot \phi = 0 \quad \text{Expression 15}$$

Expression 15 is derived for each element. Expression 15 is derived for all the elements throughout the object to be analyzed to overlap the elements. A boundary condition b is also applied to obtain the following expression.

$$K \cdot \phi = b \quad \text{Expression 16}$$

This matrix operation is solved using the CG method to obtain the potential distribution. Thus, the electrostatic energy under the given bias conditions and boundary conditions can be obtained.

Process 4

The electrostatic energy is defined using the electrostatic capacity C, and the value of the electrostatic energy I obtained as described above is substituted to derive an expression wherein the electrostatic capacity C is unknown. Since $n(n-1)/2$ electrostatic capacities are defined for n electrodes, the processes 1 through 3 are carried out with the bias conditions varied depending on the number of electrostatic capacities which are unknown. Then, the following expression is applied to obtain a system of expressions.

$$I = \frac{1}{2} \sum_{i=1}^{n} \sum_{j=1}^{n} C_{ij} (\Psi_i - \Psi_j)^2 \quad \text{Expression 17}$$

An example of the system of expression is given as Expression 18 wherein the number of the electrodes is 3. In this case, the three unknown numbers are calculated with the bias conditions changed three times. In order to simplify the calculation, the bias is given as 0 V or 1 V.

$$\begin{pmatrix} 2I_1 \\ 2I_2 \\ 2I_3 \end{pmatrix} = \begin{pmatrix} (\Psi_1 - \Psi_2)^2 & (\Psi_1 - \Psi_3)^2 & (\Psi_2 - \Psi_3)^2 \\ (\Psi_1' - \Psi_2')^2 & (\Psi_1' - \Psi_3')^2 & (\Psi_2' - \Psi_3')^2 \\ (\Psi_1'' - \Psi_2'')^2 & (\Psi_1'' - \Psi_3'')^2 & (\Psi_2'' - \Psi_3'')^2 \end{pmatrix} \cdot \begin{pmatrix} C_{12} \\ C_{13} \\ C_{23} \end{pmatrix} \quad \text{Expression 18}$$

An example of the calculation with a forward bias of 0.5 V will be described.

(Simulated Value of the Capacity)

$$C_{SIM} = 0.55e-9 (F/m)$$

(Approximated Value of the Capacity)

The distribution of impurities in the vicinity of a junction is approximated on a linear ramp basis. Since the bias value is small, the width of the barrier layer on the P-side is on the order of 0.1 $\mu$m with 0 bias. Therefore, approximation on a linear ramp basis is appropriate. The coefficient a of the linear ramp is read as described below. First, the linear ramp coefficient a for the LDD portion is read on the P- and N-sides from the graph to obtain a1=5.2e+25 (/cm$^4$) and a2=3.0e+21 (/cm$^4$), respectively. Capacity per unit area on the P-side is obtained at Cu=1.5e+5 (pF/cm$^2$) (See Sze "Physics of Semiconductor Devices, Second edition" 1981, p. 83, FIG. 17). The capacity on the N-side is negligibly small compared to this. Capacity per unit length is calculated on the assumption that the length of the bottom of the LDD is 0.1 $\mu$m and the length of the side of the LDD is 0.05 $\mu$m.

$$C_{LDD} = CU^*(0.1e-4 + 0.05e-4) = 0.23e-9 (F/m)$$

Next, capacity per unit area Cu=1.5e+5 (pF/cm²) is obtained for the drain portion in the same manner as for the LDD. Capacity per unit length is calculated on the assumption that the length of the bottom of the drain is 0.3 μm.

$$C_D = CU*0.3e-4 = 0.45e-9 (F/m)$$

Therefore, the total capacity C can be approximated as follows.

$$C_{EQN} = C_{LDD} + CD = 0.68e-9 (F/m)$$

(Comparison)

$$C_{SIM}/C_{EQN} = 0.81$$

The simulation has resulted in a value that is close to the approximated value. The fact that the simulated value is smaller by about 20 percent may be attributable to incorrectness of the estimate originating from the forward bias.

An example of the calculation with a reverse bias of 0.35 V will be described.

(Simulated Value of the Capacity)

$$C_{SIM} = 1.735e-9 (F/m)$$

(Approximated Value of the Capacity)

As in the case of the forward bias, the capacity of the LDD portion is calculated using capacity per unit area Cu=3.7e+5 (pF/cm²) based on a coefficient approximated on a linear ramp junction basis.

$$C_{LDD} = CU*(0.1e-4+0.05e-4) = 0.56e-9 (F/m)$$

Similarly, the capacity at the drain portion can be obtained as follows.

$$CD = Cu*0.3e-4 = 1.11e-9 (F/m)$$

Therefore, the total capacity C can be approximated as follows.

$$C_{EQN} = C_{LDD} + C_D = 1.67e-9 (F/m)$$

(Comparison)

$$C_{SIM}/C_{EQN} = 1.04$$

In the case of reverse bias, the difference between the results of the simulation and approximation is about 4 percent, which supports the assumption that the calculation is accurate.

As described above, there is provided a method for simulating the electrical characteristics of a semiconductor device and an input data generation apparatus for the simulation of the electrical characteristics of a semiconductor device which allow, for example, the simulation of the capacity and current density of a line in a semiconductor device to be carried out in such a manner that required data can be easily obtained, for example, on a screen and can be reused as input data for various simulators; data can be accurately generated; and the time for such operations can be shortened.

While specific illustrated embodiments have been shown and described, it will be appreciated by those skilled in the art that various modifications, changes and additions can be made to the invention without departing from the spirit and scope thereof as set forth in the following claims.

What is claimed is:
1. A method for simulating the electrical characteristics of an electronic device comprising the steps of:
   specifying the material of a part of interest of the electronic device;
   specifying the electrical characteristics of the part of interest of the electronic device; and
   specifying the shape of the part of interest of the electronic device, said specification of the shape being performed by selecting it from among several preselected simplified shape models.

2. The method for simulating the electrical characteristics of an electronic device according to claim 1, wherein the specification of the shape is performed by selecting it from among a truncated-conical shape, a hexahedral shape, and a spoon-cut shape.

3. The method for simulating the electrical characteristics of an electronic device according to claim 2, wherein the specification of the hexahedral shape is performed by selecting from among rectangular solids and a shape connecting rectangular solids.

4. The method for simulating the electrical characteristics of an electronic device according to any one of claims 1 through 3, the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

5. The method for simulating the electrical characteristics of an electronic device according to claims 1 through 4, wherein the electrical characteristics of the part of interest of the electronic device are the dielectric constant or specific resistance thereof.

6. An input data generation apparatus for simulation for generating input information required for simulating the electrical characteristics of a semiconductor device, comprising:
   a means for specifying the material, electrical characteristics, and shape of a part of interest of a semiconductor device, the specification of the shape being performed by selecting it from among several preselected simplified shape models as the input data for simulation.

7. The input data generation apparatus for the simulation of the electrical characteristics of a semiconductor device according to claim 6, wherein the specification of the shape is performed by selecting it from among a truncated-conical shape, a hexahedral shape, and a spoon-cut shape.

8. The input data generation apparatus for the simulation of the electrical characteristics of a semiconductor device according to claim 7, wherein the specification of the hexahedral shape is performed by selecting from among rectangular solids and a shape connecting rectangular solids.

9. The input data generation apparatus for the simulation of the electrical characteristics of a semiconductor device, according to any one of claims 6 through 8, wherein the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

10. An input data generation apparatus for simulation for generating input information required for simulating the electrical characteristics of a semiconductor device, comprising:

a means for specifying the material of a part of a semiconductor device;

a means for specifying the shape of the part of the semiconductor device;

a means for specifying the electrical characteristics of the part of the semiconductor device;

a means for specifying the shape of the part by selecting it from among several preselected simplified shape models; and a means for preparing the simplified shapes as mesh data in arbitrary steps for arithmetic processing thereon.

11. The input data generation apparatus for the simulation of the electrical characteristics of a semiconductor device according to claim 10, wherein the specification of the shape is performed by selecting it from among a truncated-conical shape, a hexahedral shape, and a spoon-cut shape.

12. The input data generation apparatus for the simulation of the electrical characteristics of a semiconductor device according to claim 11, wherein the specification of the hexahedral shape is performed by selecting from among rectangular solids and a shape connecting rectangular solids.

13. The input data generation apparatus for the simulation of the electrical characteristics of a semiconductor device, according to any one of claims 10 through 12, wherein the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

14. A method for simulating the electrical characteristics of a semiconductor device, comprising the steps of:

specifying the material of a part of interest of a semiconductor device;

specifying the shape of the part of interest of the semiconductor device;

specifying the electrical characteristics of the part of interest of the semiconductor device;

specifying the shape by selecting it from among several preselected simplified shape models; and defining an overall shape using said specified shapes which are overlapped in a certain order.

15. The method for simulating the electrical characteristics of a semiconductor device according to claim 14, wherein the specification of the shape is performed by selecting it from among a truncated-conical shape, a hexahedral shape, and a spoon-cut shape.

16. The method for simulating the electrical characteristics of a semiconductor device according to claim 15, wherein the specification of the hexahedral shape is performed by selecting from among rectangular solids and a shape connecting rectangular solids.

17. The method for simulating the electrical characteristics of a semiconductor device according to any one of claims 14, 15 or 16, wherein the electrical characteristics to be simulated are the electrical characteristics of a line in a semiconductor device and wherein steps are provided for inputting data indicating the material of the line to be simulated, data indicating the resistance of the line, data specifying the positions of electrodes in the line, data specifying the shape of the line, and data indicating the relationship between lines.

18. The method for simulating the electrical characteristics of a semiconductor device according to any one of claims 14, 15 or 16, wherein the electrical characteristics of the part of interest of the semiconductor device are the dielectric constant or specific resistance thereof.

* * * * *